United States Patent

Jefferson

[15] 3,657,657

[45] Apr. 18, 1972

[54] DIGITAL SINE WAVE GENERATOR

[72] Inventor: William T. Jefferson, 1461 Montelegre Drive, San Jose, Calif. 95120

[22] Filed: Aug. 3, 1970

[21] Appl. No.: 60,266

[52] U.S. Cl. ................................328/14, 235/186, 235/197, 307/227, 307/229, 307/261, 328/27, 328/186

[51] Int. Cl. ...................................H03b 19/00, H03k 13/00

[58] Field of Search ..................307/223, 220, 227, 229, 261; 328/13, 14, 27, 186; 235/150.53, 159, 186, 197

[56] References Cited

UNITED STATES PATENTS

| | | | |
|---|---|---|---|
| 3,036,223 | 5/1962 | Phillips, Jr. | 328/39 X |
| 3,215,860 | 11/1965 | Neumann | 307/227 |
| 3,340,469 | 9/1967 | Catherall et al. | 324/57 |
| 3,340,476 | 9/1967 | Thomas et al. | 328/27 |
| 3,430,073 | 2/1969 | Leonard | 307/223 X |
| 3,500,213 | 3/1970 | Ameau | 328/14 |
| 3,544,906 | 12/1970 | Dulaney et al. | 328/14 |
| 3,551,826 | 12/1970 | Sepe | 328/160 |

*Primary Examiner*—Stanley D. Miller, Jr.
*Attorney*—Owen, Wickersham and Erickson

[57] ABSTRACT

An accurate source of constant frequency pulses drives an adjustable modulus digital divider, which divides the input pulse repetition rate by exact integers. The pulse repetition rate of the output of the divider is made directly proportional to the desired frequency of a sine wave that is to be generated. The output of the divider continuously clocks a four-bit binary up-down counter from the all-zero condition to the all-one condition and then back down cyclically. This up-down counter programs a digital sine wave decoder in which logic circuits convert the binary pattern from the output of the up-down counter into a binary pattern that is a stepwise approximation to a sine wave. A conventional digital-to-analog converter converts the binary pattern from the sine wave decoder into a corresponding analog signal, which is filtered to remove undesirable frequency components. The result is a reasonably pure sine wave whose frequency is accurately controlled by the pulse repetition rate from the variable modulus divider.

10 Claims, 12 Drawing Figures

INVENTOR.
WILLIAM T. JEFFERSON
BY
Owen, Wickersham & Erickson
ATTORNEYS

INVENTOR.
BY WILLIAM T. JEFFERSON
Owen, Wickersham & Erickson
ATTORNEYS

INVENTOR.

WILLIAM T. JEFFERSON

BY

Owen, Wickersham & Erickson

ATTORNEYS

DIGITAL SINE WAVE GENERATOR

BACKGROUND OF THE INVENTION

In many applications such as in a MODEM (modulator/demodulator) it is necessary to provide an accurate sine wave source. For example, a MODEM might use the frequency 2200 Hertz as the mark frequency and the frequency 1200 Hertz as the space frequency. A sine wave generator capable of reliably operating at either frequency and capable of accurately shifting back and forth between these two frequencies is very useful. Although a high degree of frequency accuracy is required, the shape or purity of the sine wave need not be perfect, and, indeed, a fairly coarse approximation to a sine wave shape is acceptable in many cases. For example, the resolution of a signal generated by a four-bit (16 level) binary code has been found workable.

SUMMARY OF THE INVENTION

In order to meet these requirements, the invention provides a digital sine wave generator wherein an accurate oscillator such as a crystal-controlled oscillator drives an adjustable modulus divider. The division ratio of the modulo-X divider can be easily and accurately varied to provide a pulse train whose pulse repetition rate is directly proportional to the desired frequency of the sine wave output. The modulated pulse train drives a continuously running counter, such as an up-down counter, which continuously programs a digital sine wave decoder, and the decoder converts the binary coded decimal stairstep wave form from the continuously running counter into a stepwise approximation to a sine wave. A digital to analog converter converts this binary pattern into a corresponding analog signal. While this analog signal is a rather crude stepwise approximation to a sine wave, its fundamental frequency is quite accurate, and the irregularities in the approximation are easily removed with a simple filter.

DESCRIPTION OF THE PREFERRED EMBODIMENTS

Figure 1:
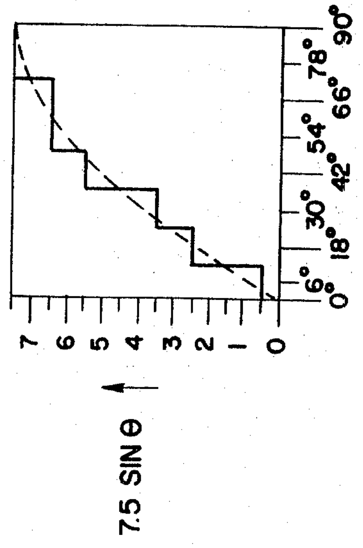
FIG. 1 is a sine wave stepwise approximation plot of values tabulated in Table I in the text for the first ninety degrees of a sine function.

FIG. 1 indicates how a stepwise approximation to a sine wave may be arrived at, given sixteen possible discrete amplitude steps. FIG. 1 is based on the following table:

TABLE I

Sine Wave Step-Wise Approximation Table

| | Sin | 7.5Sin | Closest Step |
|---|---|---|---|
| 0° | 0.00000 | 0.000 | — |
| 6° | 0.10453 | 0.784 | 0.5 |
| 18° | 0.30902 | 2.318 | 2.5 |
| 30° | 0.50000 | 3.750 | 3.5 |
| 42° | 0.66913 | 5.018 | 5.5 |
| 54° | 0.80902 | 6.068 | 6.5 |
| 66° | 0.91355 | 6.852 | 6.5 |
| 78° | 0.97815 | 7.336 | 7.5 |
| 90° | 1.00000 | 7.500 | 7.5 |

Figure 2:
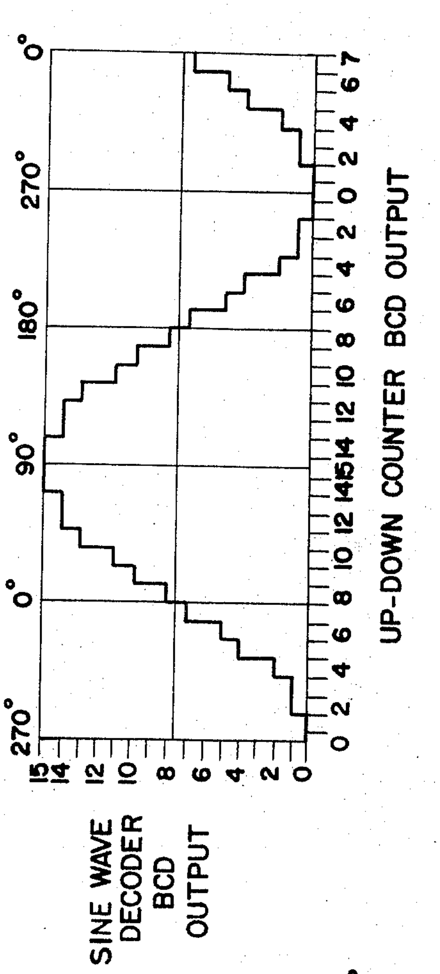
FIG. 2 is a sine wave decoder output in binary coded decimal form plotted against the output of a counter also in binary coded decimal form.

Only the first 90° of a sine wave need be considered in arriving at the stepwise approximation values for the decoder. Once these values have been determined, using Table I and FIG. 1, a complete 360° plot of the required sine wave can be made, giving what is shown in FIG. 2. FIG. 2 also describes the required sine wave decoder binary coded decimal output vs. the up-down counter binary coded output, which will be supplied to the input terminals of the decoder. By tabulation of the values shown diagramatically in FIG. 2, the following truth table is derived:

TABLE 2.—SINE WAVE DECODER TRUTH TABLE

| Decoder input | | | | | Decoder output | | | | |
|---|---|---|---|---|---|---|---|---|---|
| Decimal | D | C | B | A | Decimal | $2^3$ | $2^2$ | $2^1$ | $2^0$ |
| 0 | 0 | 0 | 0 | 0 | 0 | 0 | 0 | 0 | 0 |
| 1 | 0 | 0 | 0 | 1 | 0 | 0 | 0 | 0 | 0 |
| 2 | 0 | 0 | 1 | 0 | 1 | 0 | 0 | 0 | 1 |
| 3 | 0 | 0 | 1 | 1 | 1 | 0 | 0 | 0 | 1 |
| 4 | 0 | 1 | 0 | 0 | 2 | 0 | 0 | 1 | 0 |
| 5 | 0 | 1 | 0 | 1 | 4 | 0 | 1 | 0 | 0 |
| 6 | 0 | 1 | 1 | 0 | 5 | 0 | 1 | 0 | 1 |
| 7 | 0 | 1 | 1 | 1 | 7 | 0 | 1 | 1 | 1 |
| 8 | 1 | 0 | 0 | 0 | 8 | 1 | 0 | 0 | 0 |
| 9 | 1 | 0 | 0 | 1 | 10 | 1 | 0 | 1 | 0 |
| 10 | 1 | 0 | 1 | 0 | 11 | 1 | 0 | 1 | 1 |
| 11 | 1 | 0 | 1 | 1 | 13 | 1 | 1 | 0 | 1 |
| 12 | 1 | 1 | 0 | 0 | 14 | 1 | 1 | 1 | 0 |
| 13 | 1 | 1 | 0 | 1 | 14 | 1 | 1 | 1 | 0 |
| 14 | 1 | 1 | 1 | 0 | 15 | 1 | 1 | 1 | 1 |
| 15 | 1 | 1 | 1 | 1 | 15 | 1 | 1 | 1 | 1 |

Figure 5:
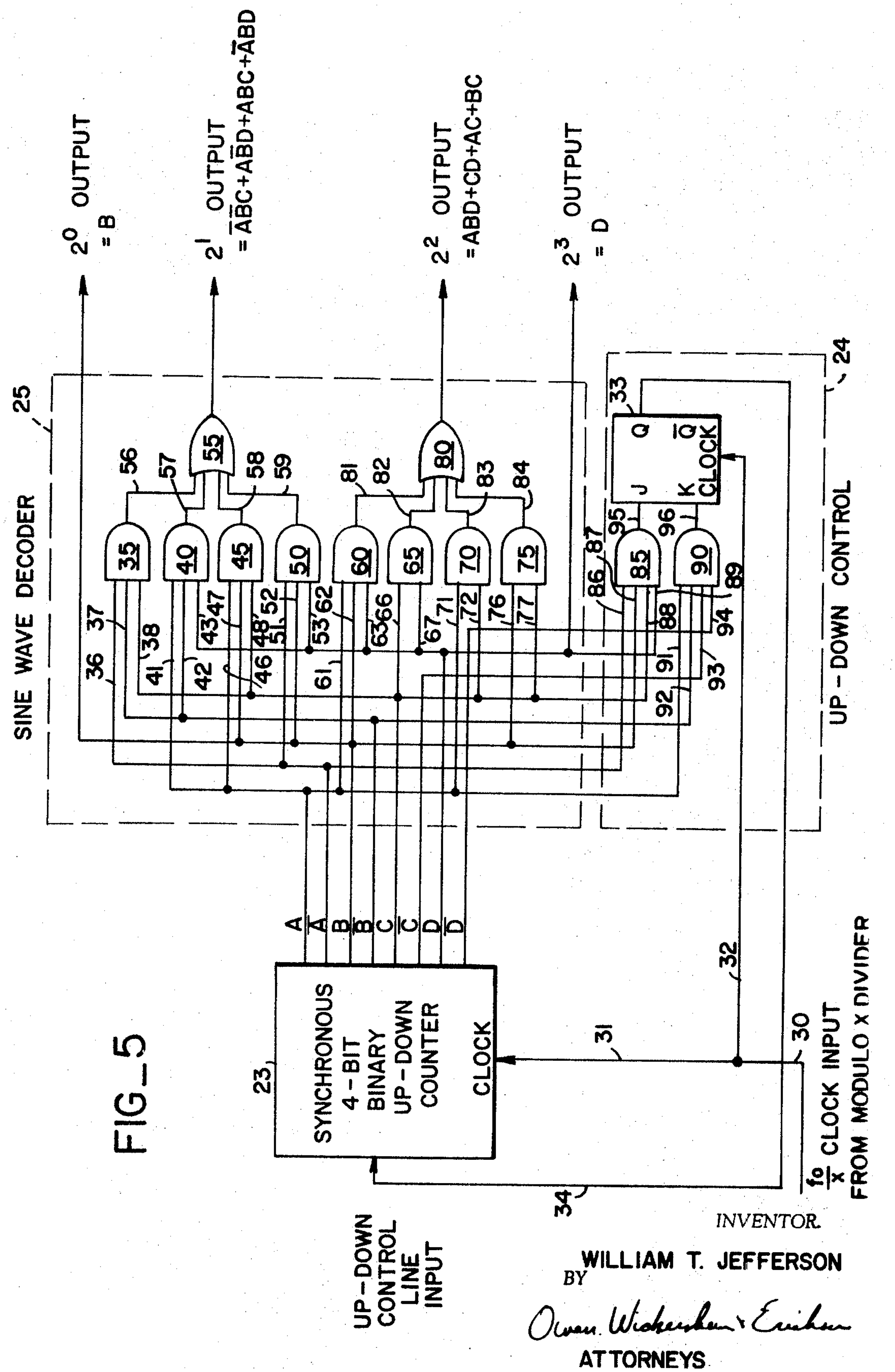
FIG. 5 is a more detailed schematic diagram of the up-down counter, up-down control, and sine wave decoder of the device of FIG. 3.

By Boolean algebra:

$2^0=B.$ $2^1=\overline{A}\,\overline{B}C+A\overline{B}D+ABC+\overline{A}BD.$ $2^2=ABD+CD+AC+BC.$ $2^3=D.$ The left hand side of the truth table of Table II indicates the input to a decoder supplied from a 16 state counter. The right hand side of the Table II indicates the required decoder output for each of the given 16 possible input states. Boolean algebra enables writing the four logic equations that appear immediately below the truth table in Table II. These four Boolean expressions and their corresponding ease of implementation form the basis for this invention, and one of many possible implementations of the four expressions is shown in FIG. 5. The schematic of the digital sine wave decoder shown in FIG. 5 is not necessarily the most efficient implementation of the required four Boolean expressions, but it is a good one, and it will be apparent to those of ordinary skill in the art that implementation of the logic may be modified and yet perform substantially the same function.

Figure 3:
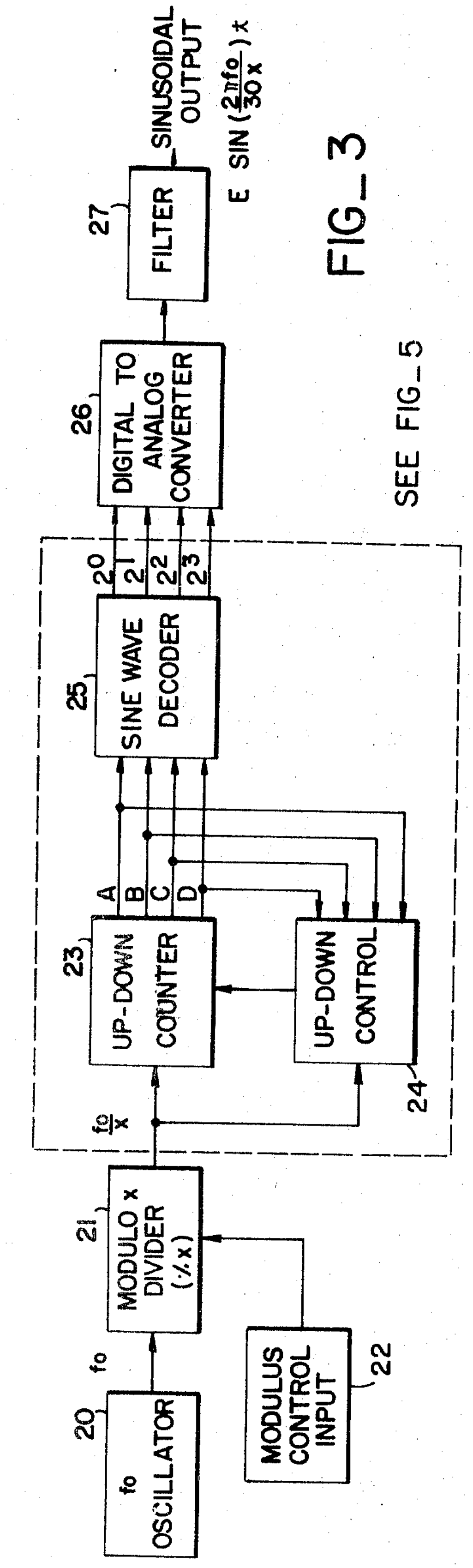
FIG. 3 is a functional block diagram of a digital sine wave generator embodying the principles of the invention.

FIG. 3 is a functional block diagram and shows the signal flow. A stable oscillator 20, which may be a crystal oscillator, generates a base frequency $f_o$ and sends it through a modulo-X divider 21, which provides external division ratio control via a modulus control input 22 and provides the wave form (*a*) of FIG. 4 to a counter 13. The counter 23 may be an up-down counter continuously clocked through all 16 of its possible states, counting up from all zeros to all ones and then counting down to all zeros again back up through all ones, etc., over and over, in a continuously running cycle. It provides the wave forms (*b*) and (*c*) of FIG. 4, which will be explained later. An up-down control 24 enables the up-down counter 23 to follow the repetitive up-down-up-down pattern. The signals then go to a sine wave decoder 25, which gives the waveform (e) of FIG. 4, and feeds its signals to a digital-to-analog converter 26, giving an output with the waveform (f) of FIG. 4. Finally, the signal from the digital-to-analog converter 26 is smoothed by a filter 27, giving the final output curve (*g*) of FIG. 4, which is sinusoidal and corresponds well to the form $$y=E\sin(2\pi f_o/30x)\,t$$

Of the elements shown in the block diagram of FIG. 3, further explanation is needed only for the up-down counter 23, the up-down control 24, and the sine wave decoder 25, and a presently preferred example of them is shown in FIG. 5. The oscillator 20, modulo-X divider 21, modulus control output 22, digital-to-analog converter 26, and filter 27 are well known items.

Referring now to FIG. 5, the train of clock pulses 30 at rate $fo/x$ from the modulo-x divider 21 is applied by a clock input line 31 to the up-down counter 23 and by a clock input line 32 to a J-K flip flop 33.

The up-down counter 23 has a four-bit binary output on lines A, $\bar{A}$, B, $\bar{B}$, C, $\bar{C}$, D and $\bar{D}$. Line D is the most significant bit, line C is the second most significant bit, line B is the third most significant bit and line A is the least significant bit. Lines D and $\bar{D}$ are binary complements, as are C and $\bar{C}$, B and $\bar{B}$, and A and $\bar{A}$. An up-down control line input 34 determines whether the binary up-down counter 23 is to index up one count or down one count on the next succeeding clock pulse applied to the clock input line 31. The eight binary output lines from the up-down counter 23 are the eight input lines to the sine wave decoder 25.

The sine wave decoder 25 has four binary outputs. Output $2^3$ is the most significant bit, output $2^2$ is the second most significant bit, output $2^1$ is the third most significant bit and output $2^0$ is the least significant bit. By inspection, it may be seen that output $2^0$ corresponds directly to input B and that output $2^3$ corresponds directly to input D. By Boolean algebra, it may be seen that output $2^1$ equals $\bar{A}\,\bar{B}\,C+A\,\bar{B}\,D+A\,B\,C+\bar{A}\,B\,D$ and that output $2^2$ equals $A\,B\,D+C\,D+A\,C+B\,C$.

The sine wave decoder is composed of AND gates and OR gates connected in the following manner. An AND gate 35 has an input 36 connected to $\bar{A}$, an input 37 connected to $\bar{B}$ and an input 38 connected to C. An AND gate 40 has an input 41 connected to A, an input 42 connected to $\bar{B}$, and an input 43 connected to D. An AND gate 45 has an input 46 connected to A, an input 47 connected to B, and an input 48 connected to C. An AND gate 50 has an input 51 connected to $\bar{A}$, and input 52 connected to B, and an input 53 connected to D.

An OR gate 55 has an input 56 comprising the output of the AND gate 35, an input 57 comprising the output of the AND gate 40, an input 58 comprising the output of the AND gate 45, and an input 59 comprising the output of the AND gate 50. The output of the OR gate 55 is the $2^1$ output of the sine wave decoder 25.

An AND gate 60 has an input 61 connected to A, an input 62 connected to B, and an input 63 connected to D. An AND gate 65 has an input 66 connected to C and an input 67 connected to D. An AND gate 70 has an input 71 connected to A and an input 72 connected to C. An AND gate 75 has an input 76 connected to B and an input 77 connected to C. An OR gate 80 has an input 81 comprising the output of the AND gate 60, an input 82 comprising the output of the AND gate 65, an input 83 comprising the output of the AND gate 70, and an input 84 comprising the output of the AND gate 75. The output of the OR gate 80 is the $2^2$ output of the sine wave decoder 25.

The output $2^0$ of the sine wave decoder 25 is connected to B, and the output $2^3$ of the sine wave decoder 25 is connected to D. These four outputs of the sine wave decoder 25 are the inputs to the digital to analogue converter 26. From the above description of unit 25, it is clear that it operates to effect a conversion of the binary coded output from the counter to a second binary coded output, which is a digital representation of a wave which is approximately of sinusoidal form.

The up-down control 24 has two four-way AND gates 85 and 90 and the J-K flip flop 33. Clock pulses at a rate $f_o/x$ enter the clock input line 32 of the J-K flip flop 33. The output line 34 of the up-down control 24 comes from the Q output of the J-K flip flop 33 and is the up-down control line input for the up-down counter 23.

In the up-down control 24, the AND gate 85 has an input 86 connected to $\bar{A}$, an input 87 connected to B, an input 88 connected to $\bar{C}$ and an input 89 connected to D. The AND gate 90 has an input 91 connected to A, an input 92 connected to $\bar{B}$, an input 93 connected to $\bar{C}$, and an input 94 connected to $\bar{D}$. The output 95 of the AND gate 85 comprises the J input of the J-K flip flop 33, while the output 96 of the AND gate 90 comprises the K input of the J-K flip flop 33. It may be seen from this arrangement that the AND gate 85 will detect state 14 of Table II, that is $D\;C\;B\;\bar{A}$, from the binary counter and will cause the J-K flip flop 33 to set on the next succeeding clock pulse from the modulo-x divider 21. This same clock pulse also causes the up-down counter 23 to index up to state 15 of Table II, that is DCBA. When the J-K flip flop 33 goes to the set condition it causes the up-down control line input 34 to the up-down counter 23 to change state. This causes the up-down counter 23 to begin counting down from state 15 on the next succeeding clock pulse from the modulo-X divider 21. When the up-down counter 23 has counted down to state 1; that is $\bar{D}\;\bar{C}\;\bar{B}\;A$, the AND gate 90 detects this state and causes the J-K flip flop 33 to reset on the next succeeding clock pulse from the modulo-x divider 21. This next clock pulse also indexes the up-down counter 23 down to state 0; that is $\bar{D}\;\bar{C}\;\bar{B}\;\bar{A}$. As the J-K flip flop 33 resets, it causes the up-down control line input 34 to the up-down counter 23 to change state again to the count-up condition. This causes the up-down counter 23 to begin counting up from state 0; that is $\bar{D}\;\bar{C}\;\bar{B}\;\bar{A}$. The up-down control 24 continues to switch the up-down control line 34 back and forth between the count-up condition and the count-down condition as long as clock pulses enter from the modulo-x divider 21.

As can be seen from the schematic diagram of the sine wave decoder 25, the logical implementation of the 16-state stepwise approximation to a sine wave is extremely simple. Therein lies an important feature of this invention. The fact that the $2^0$ output, and the $2^3$ output of the sine wave decoder 25, require no logic gates in their implementation enables the sine wave decoder 25 logic to be very simple.

There are valuable features unique to this 16 state digital sine wave generator. While a 16-level stepwise approximation to a sine wave is inferior in fidelity of reproduction to a 17-level, 18-level or even higher ordered approximation, higher ordered approximations require a more complicated sine wave decoder than the one that can be used in a 16-level approximation. The four simple Boolean expressions of Table II, required for the 16-level approximation, enable the use of the simple and correspondingly inexpensive decoder 25 to be used. For example, as shown in FIG. 5, the $2^0$ output, the least significant bit, requires no gates at all in its implementation. It is simply equal to B, the third most significant bit out of the four bit up-down counter. Furthermore, the $2^3$ output the most significant bit out of the decoder, also does not require any logic gates in its implementation. The $2^3$ output is simply equal to D, the most significant bit out of the four-bit up-down counter. The only gates that are required for the 16-level sine wave decoder 25 are the gates required for the $2^1$ output and the $2^2$ output, and even these gating structures are comparatively simple. Any higher ordered stepwise approximation to the sine wave would require many more gates in the sine wave decoder, as well as a higher ordered up-down counter; that is, an up-down counter made up of more than four binary stages.

By inspection, a 15-level, 14-level or lower ordered stepwise approximation to a sine wave would be less pure in fidelity of reproduction and would have correspondingly higher distortion content. The 16-level stepwise approximation to the sine wave results in the most efficient implementation circuitry. Since efficiency in engineering is the true value of any invention, this particular 16-level approximation results in an especially valuable implementation of the invention.

Figures 4, 4A, 4B, 4C, 4D, 4E, 4F, 4G:
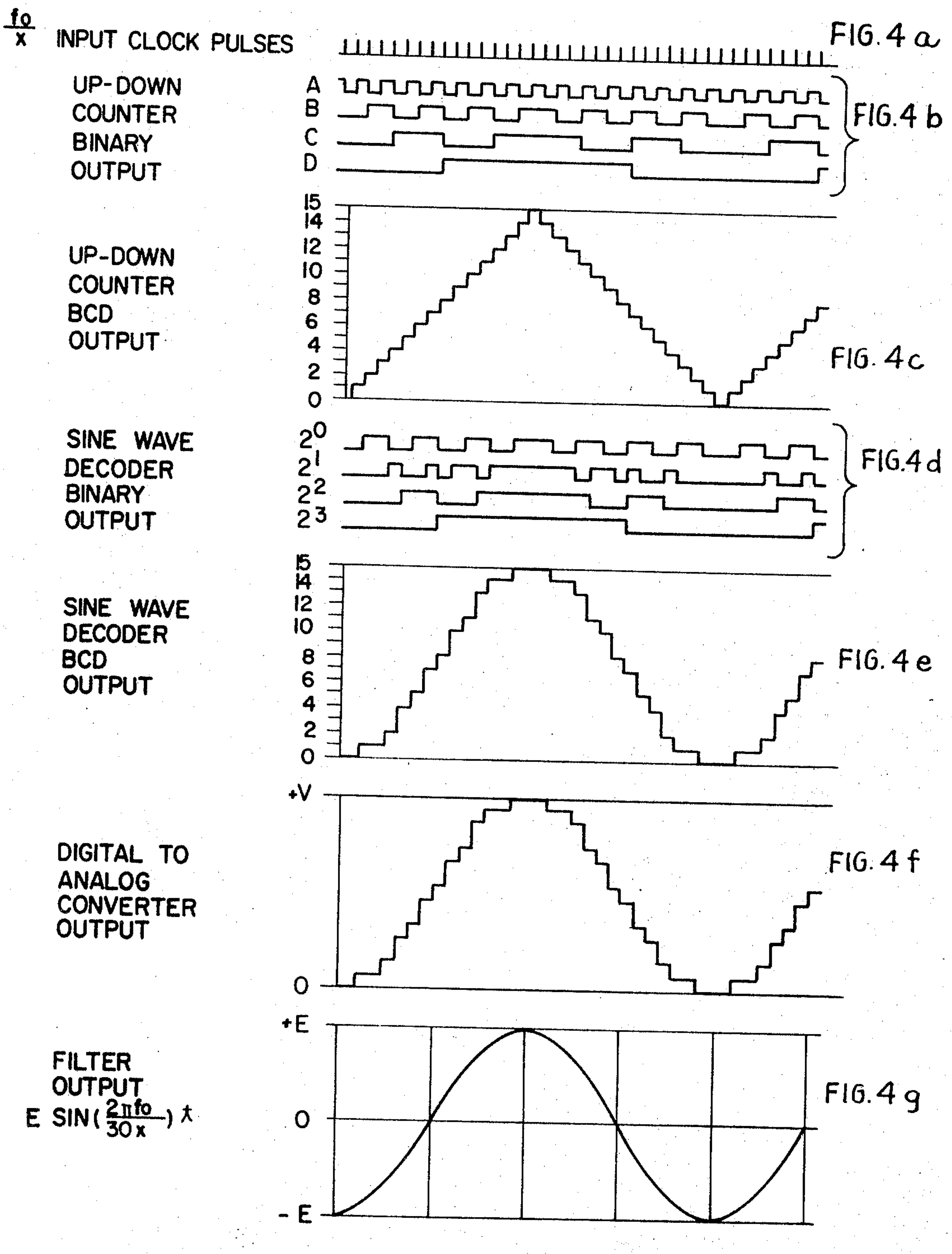
FIG. 4 shows a series of digital sine wave generator wave forms, (*a*)through (*g*), produced at various steps of the device of FIG. 3.

In operation, the oscillator 20 and divider 21 provide input clock pulses as shown at (a) in FIG. 4 to the up-down counter 23. The up-down control 24 enables the up-down counter to follow a repetitive up,down, up,down pattern by switching the sense of the up-down control line input 34 to a binary counter (see FIG. 5) whenever the binary counter 23 reaches the sixteenth state in a particular count sequence. In this manner, the up-down control 24 never allows the up-down counter 23 to "roll over" from, say, state fifteen to state zero or from state zero to state 15. Instead, the four-way AND gate 85 recognizes state 14 and conditions the J-K binary 33 to set on the next incoming clock pulse. This clock pulse indexes the counter up to state fifteen, sets the J-K binary 33 and thereby conditions the binary up-down counter 23 to begin counting downwards from state 15. In a similar manner, the four-way AND gate 90 on the K input of the up-down binary 33 senses state one of the up-down counter 23 and conditions the up-down control binary 33 to reset on the next incoming clock pulse. This clock pulse indexes the up-down counter 23 down to state zero and resets the up-down control binary 33, thereby conditioning the binary up-down counter 23 to begin counting upwards from the all-zero state. This up-down cycle continues as long as clock pulses are allowed to enter the digital sine wave generator.

The digital sine wave decoder 25 operates on the four-bit binary code (waveform (*d*) of FIG. 4) received from the up-down counter 23 and converts this code into a binary code that is a stepwise approximation to a sine wave, namely waveform (*e*) of FIG. 4. The sine wave decoder 25 operates according to the sine wave decoder truth table, Table II, and is implemented, logically, using the four Boolean expressions that are derived from the decoder truth table, the four Boolean expressions being extremely simple to implement. This simplicity is very important.

In the digital-to-analog converter 26, the sine-wave approximation (*f*) of FIG. 4 is produced and the filter 27 converts this to the desired sine wave (*g*) of FIG. 4.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. A digital waveform generator comprising means for generating a serial pulse train, counting means for receiving said serial pulse train and continuously counting pulses in said pulse train in a uniform cycle, and for providing a first binary coded output corresponding to said count, and code conversion means receiving only said first binary coded output and connected to said means for generating only through said counting means for modifying said output to provide a second binary coded output approximating a trigonometric function.

2. The generator of claim 1 wherein the trigonometric function approximated by said code conversation means is a sine.

3. The generator of claim 2 having a digital-to-analog converter receiving the sine approximation from said code conversation and filter means fed by the output from said converter for smoothing said sine approximation to a smooth sine wave.

4. The generator of claim 2 wherein said means for generating a serial pulse train comprises oscillator means for generating a stable frequency, and a modulo-X divider means for dividing said stable frequency by a predetermined number to provide a serial pulse train having a repetition rate dependent on said predetermined number.

5. The generator of claim 4 further comprising, digital-to-analog converter means receiving said binary coded output from the code conversion means to provide an analog signal in response to the second binary coded output.

6. The generator of claim 5 wherein said counting means provides a 4-bit binary coded output to said conversion means on four parallel lines which is continuously and cyclicly varying from a decimal value of 0 to 15 to 0, and wherein said conversion means modifies said binary coded output by providing a 4-bit, 4 line parallel binary coded converted output having its least significant bit corresponding to the second least significant bit of the counter means output, its most significant bit corresponding to the most significant bit of the counter means output, its second most significant bit corresponding to $\overline{AD}B+CD+AC+BC$, and its second least significant bit corresponding to $ABC+ABD+ABC+ABD$, where D,C,B, and A are the outputs of the counter means in descending order of significance and the operations are those of Boolean algebra.

7. The generator of claim 1 wherein said counting means provides a 4-bit binary coded output on four parallel lines, said output continuously and cyclicly varying from a decimal value of 0 to 15 to 0, and wherein said conversation means modifies said binary coded output by providing a 4-bit, 4 line parallel binary coded output having its least significant bit corresponding to the second least significant bit of the the counter means output, its most significant bit corresponding to the most significant bit of the counter means output, its second most significant bit corresponding to $ABD+CD+AC+BC$ and its second least significant bit corresponding to $\bar{A}\bar{B}C+A\bar{B}D+ABC+\bar{A}BD$, where D,C,B, and A are the outputs of the counter means in descending order of significance and the operations are those of Boolean algebra.

8. A digital sine wave generator, including in combination:

oscillator means for generating a stable base frequency, a modulo-X divider receiving the output of said oscillator means and dividing it by a selected integer, a four-bit binary up-down counter receiving the output from said divider, up-down control means also receiving the output from said divider for reversing said up-down counter at each end of its counting cycle to keep it continuously counting up then down then up and so on, four-bit binary sine-wave decoder means receiving as its sole input the output from said counter and providing a four-bit binary coded output, a four-bit binary digital-to-analog converter receiving the output from said decoder means and providing a sine wave approximation as its output, and filter means receiving the output from said converter and smoothing it to a true sine wave.

9. The generator of claim 8 wherein said decoder means provides a direct $2^0$ output without gates, a direct $2^3$ output without gates, a $2^1$ output through four AND gates feeding through one OR gate, and a $2^2$ output through four AND gates feeding through one OR gate.

10. The generator of claim 8 wherein said control means comprises two four-input AND gates, each connected to half of the outputs from said counter, and a J-K flip flop connected to the output from said AND gates and connected to said counter by a control line.

* * * * *